(12) United States Patent
Tang

(10) Patent No.: US 7,428,176 B2
(45) Date of Patent: Sep. 23, 2008

(54) CHARGE PUMP FOR PROGRAMMABLE SEMICONDUCTOR MEMORY

(75) Inventor: Kam-Fai Tang, Fremont, CA (US)

(73) Assignee: Fremont Micro Devices, Inc., Fremont, CA (US)

( * ) Notice: Subject to any disclaimer, the term of this patent is extended or adjusted under 35 U.S.C. 154(b) by 107 days.

(21) Appl. No.: 11/541,885

(22) Filed: Oct. 2, 2006

(65) Prior Publication Data

US 2007/0025165 A1    Feb. 1, 2007

Related U.S. Application Data

(62) Division of application No. 10/869,085, filed on Jun. 16, 2004, now Pat. No. 7,116,587.

(51) Int. Cl.
*G11C 5/14* (2006.01)

(52) U.S. Cl. .................................. 365/189.09; 365/226
(58) Field of Classification Search ............ 365/189.09, 365/226, 185.23; 327/537
See application file for complete search history.

(56) References Cited

U.S. PATENT DOCUMENTS

| 4,673,829 | A | * | 6/1987 | Gupta | ......................... | 327/537 |
| 5,861,772 | A | * | 1/1999 | Lee | ............................. | 327/589 |
| 6,507,237 | B2 | * | 1/2003 | Hsu et al. | .................... | 327/538 |

* cited by examiner

*Primary Examiner*—Anh Phung
(74) *Attorney, Agent, or Firm*—Trop, Pruner & Hu, P.C.

(57) ABSTRACT

A depletion type active capacitor may transfer charge from an oscillator to an address line that needs to be boosted for programming. Such a charge pump may be useful in semiconductor memories such as flash memories, EEPROM memories, and NAND EEPROM memories. In some embodiments, relatively low supply voltages can be boosted.

19 Claims, 2 Drawing Sheets

CHARGE PUMP FOR PROGRAMMABLE
SEMICONDUCTOR MEMORY

CROSS-REFERENCE TO RELATED APPLICATIONS

This application is a divisional of U.S. patent application Ser. No. 10/869,085, filed on Jun. 16, 2004 now U.S. Pat. No. 7,116,587.

BACKGROUND

This invention relates to programmable semiconductor memories and, more particularly, to charge pumps for such memories.

Some programmable memory devices, such as electrically erasable programmable read on memories (EEPROMs) and flash memories, require relatively high programming voltages. The programming voltages may be significantly higher than the supply voltage available on conventional integrated circuits. Thus, a boosted voltage must be supplied to a selected address line to be programmed. That voltage may be from a few volts to over ten volts above the supply voltage $V_{cc}$. At the same time, unselected address lines should not draw DC current to the greatest possible extent.

A charge pump may be provided to increase the voltage provided by the supply voltage to the higher voltage needed for programming. The demands on the charge pump have increased as the availability supply voltages have dropped dramatically. Even with lower supply voltages, the need still exists for a relatively high programming voltage. A charge pump is needed that can pump a relatively low supply voltage, such as a supply voltage of 1.5 volts or less, up to the levels needed to program certain semiconductor memories.

Thus, there is a need for better charge pumps for programmable semiconductor memories.

DETAILED DESCRIPTION

Figure 1:
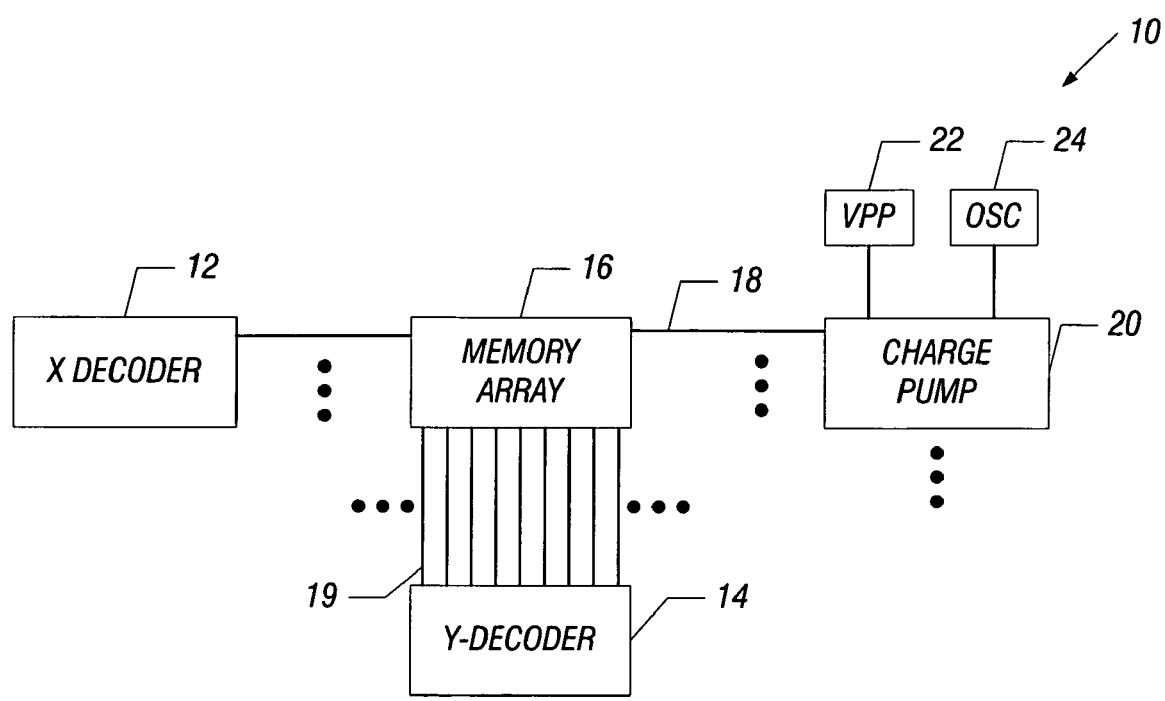
FIG. 1 is a schematic depiction of a memory in accordance with one embodiment of the present invention.

Referring to FIG. 1, a semiconductor memory 10 may be a flash memory, such as a NAND flash memory, or an EEPROM, to mention two examples. The memory 10 includes a memory array 16 having cells to store data. These cells may be in keeping with an appropriate memory technology. The cells may be arranged on address lines commonly called rows or word lines and columns or bitlines.

The address lines can be accessed by an X decoder 12 and a Y decoder 14. Thus, in one embodiment, the X decoder 12 selects an address line 18 for either reading or programming and the Y decoder selects another address line 19. In this way, one or more cells may be accessed by the X decoder 12 and the Y decoder 14.

The selected address line 18 or 19 may be coupled to a charge pump 20. The charge pump 20 receives a voltage from a higher voltage source (Vpp) 22 that supplies a voltage higher than the supply voltage Vcc. While the charge pump 20 is shown as being connected to an address line 18 in the form of a word line, a charge pump 20 can also be used in conjunction with a bit or column address line 19.

An oscillator 24 may provide a square wave voltage pulse having an amplitude corresponding to that of the supply voltage and a frequency on the order of hundreds of kiloHertz to 10 megahertz, for example. On positive transitions of the oscillator's square wave pulse, the voltage supplied by the charge pump 20 to the selected address line 18 may increase by an increment $\Delta WL$. On the negative transitions of the oscillator 24, the supplied voltage would otherwise fall except for the provision of the higher voltage source (Vpp) 22. The source 22 maintains the potential supplied by the charge pump 20 during the negative transitions of the oscillator 24 voltage.

Figure 2:
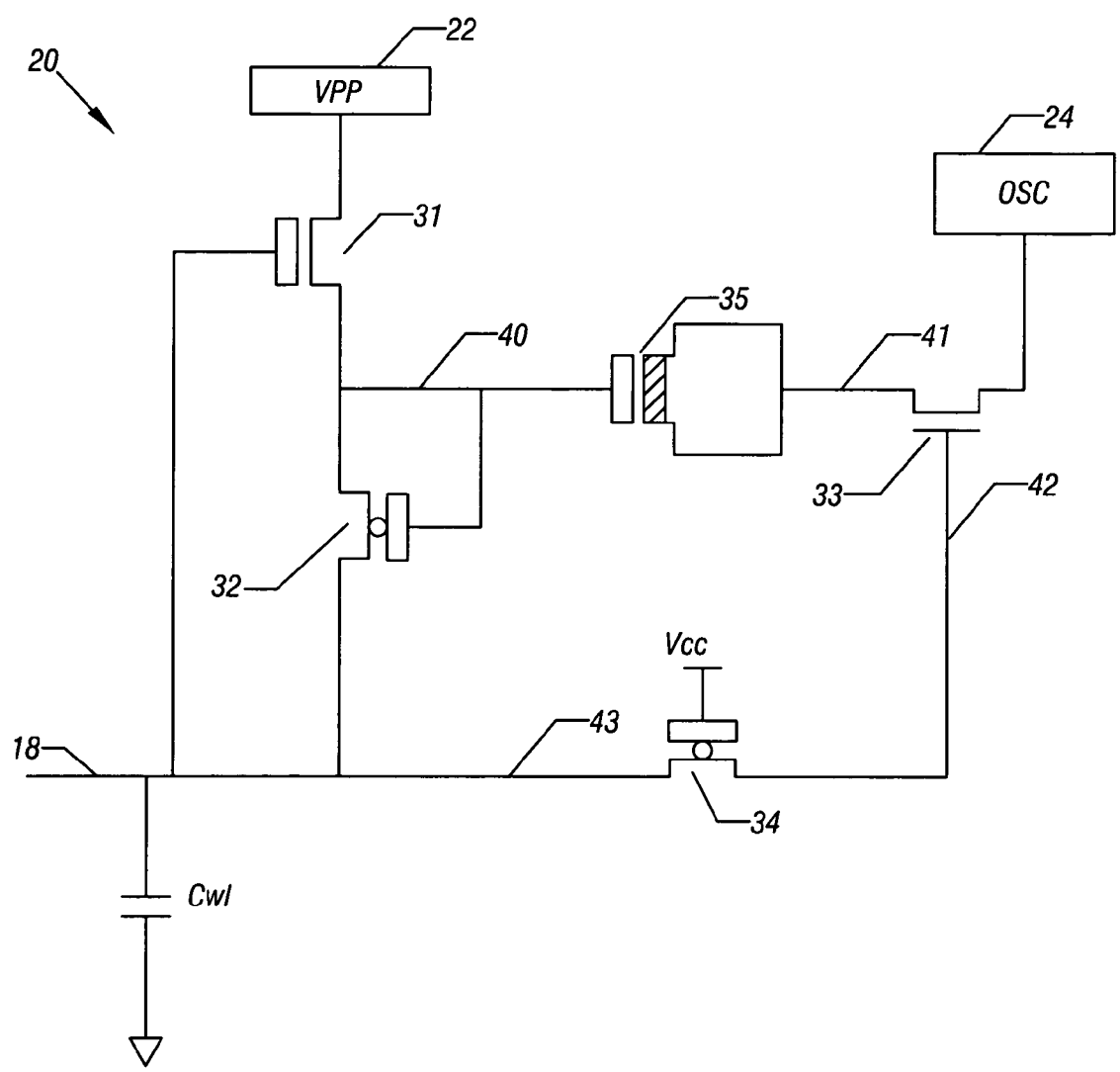
FIG. 2 is a circuit diagram of a charge pump in accordance with one embodiment of the present invention.

Address line 18 or 19 voltages may be efficiently boosted from a relatively low supply voltage $V_{cc}$ of about 1.5 volts or less. An active capacitor 35, shown in FIG. 2, couples the oscillator 24 voltage to a charge transfer node 40. An enhancement transistor 31 may have its drain coupled to the higher voltage source 22, and its source coupled to the charge transfer node 40. The gate of the transistor 31 is driven by the potential on address line 18, which may sometimes be a selected address line and at other times may be an unselected address line. The threshold voltage of the transistor 31, in one embodiment, may range from 0.3 to 1 volt. Thus, potential from the source 22 is only applied to a selected address line due to the operation of the transistor 31, because the transistor 31 is off when the address line 18, coupled to its gate, is not selected.

A charge transfer transistor 32 has its gate and drain coupled to the charge transfer node 40 and its source coupled to the selected address line 18. The threshold voltage of the transistor 32 may range from 0 to 0.3 volts in one embodiment. It may be a so-called native enhancement transistor. The transistor 32 ensures that only selected address lines are charged up.

An oscillator swing control transistor 33 has its drain coupled to the output of the oscillator 24 and is gated by the source of a transistor 34. The transistor 33 may be a low voltage or logic type device in one embodiment.

An active capacitive mode device 35 may be a depletion transistor with a threshold voltage range from −3 volts to −1 volt in one embodiment of the present invention. The gate of the active capacity mode device 35 is coupled to the charge transfer node 40 and both its source and drain may be coupled to the source of the oscillator control transistor 33.

Thus, the active capacity mode device 35 behaves as an active capacitor. An active capacitor is a capacitor implemented by an active device such as a transistor or diode. The gate capacitance of the device 35 may be 8 to 10 times that of the transistor 32 in one embodiment.

The transistor 34 may have its gate tied to the supply voltage $V_{cc}$ while its drain and source are coupled to the selected address line 18 and oscillator control device 33, respectively. The transistor 34 may be a native enhancement transistor with a threshold voltage from 0 to 0.3 volts in one embodiment.

During programming of a cell or cells on a selected address line 18, the address line 18 is charged up to the supply voltage by the X decoder 12. The unselected address lines are discharged to ground through the X decoder 12.

At the onset of programming, the selected address line 18 is at the supply voltage $V_{cc}$ as charged by the X decoder 12. The node 42 between the gate of the transistor 33 and the source of the transistor 34 follows the potential on the address line 18 until that potential reaches one threshold voltage of the transistor 33 below the supply voltage. Since the threshold voltage of the transistor 34 is approximately zero (and assuming negligible source bias effect on the threshold voltage of the transistor 34), the node 42 is at the supply voltage.

For example, in one embodiment of the present invention, the threshold voltage of the transistors 31 and 33 may be 1 volt and the threshold voltages of the transistors 32 and 34 may be zero volts, while the threshold voltage of the transistor 35 may be −2 volts. Assuming a supply voltage of 1.5 volts, at a gate voltage of 1.5 volts, the transistor 31 charges up the charge transfer node 40 to about 0.5 volts which is one threshold voltage of the transistor 31 below the voltage on the address line 18. Meanwhile, the oscillator swing control transistor 33 turns on, with its gate voltage at 1.5 volts and its drain coupled to the oscillator 24, still at zero volts.

The oscillator 24 starts ramping up from zero volts to the supply voltage (assumed for illustration purposes to be 1.5 volts). The node 42, coupled by the transistor 33's gate capacitance, may be bootstrapped from the supply voltage to almost twice the supply voltage in one embodiment.

Since the maximum voltage across the gate and drain or source of the transistor 33 is the supply voltage, a low voltage or a logic enhancement type device can be utilized as the transistor 33. Accordingly, the transistor 33 can be laid out in a smaller area and, at the same time, provide a high channel conductance with its smaller threshold voltage. Hence, the node 41 can receive the full supply voltage magnitude boost to the supply voltage level. The node 42 is free to be coupled up since the transistor 34 has both its gate and drain at the supply voltage.

Meanwhile, the charge transfer node 40 is coupled up from the active capacity mode device 35. When the device 35 has a gate capacitance at least eight times that of the transistor 32, the charge transfer node 40 is boosted up from its initial 0.5 volts until the device 32 turns on.

The node 40 starts to charge the address line 18 when its voltage is larger than the threshold voltage of the transistor 32 plus the voltage on the source of the device 32 or 0 volts plus 1.5 volts in the illustrative example.

The node 40 needs to move up by one volt to 1.5 volts to turn on the device 32. Since the node 40 has a capacitance divided between the gate capacitance of the transistor 32 (C32) and the gate capacitance of the active capacity mode device 35 capacitance (C35), the differential oscillator swing voltage ($\Delta OSC1$) necessary to couple the node 40 (one volt) can be calculated as:

$$\Delta OSC1 = 1v \times (C32+C35)/C35.$$

The remaining oscillator voltage swing magnitude ($\Delta OSC2$) may then be used to charge up the address line 18 after the device 32 turns on:

$$\Delta OSC2 = V_{cc} - \Delta OSC1.$$

The incremental address line 18 voltage change ($\Delta WL$), on each oscillator 24 pulse (that is the step by which the address line voltage increases on each positive transition of the oscillator 24 pulse) is:

$$\Delta WL = \Delta OSC2 \times C35/(CWL+C35+C32)$$

where CWL is the inherent capacitance of the address line 18.

For example, if the capacitance of the device 35 is ten times the capacitance of the transistor 32, while the address line capacitance (CWL) is five times the capacitance of the device 35, the incremental address line 18 voltage change, $\Delta WL$, becomes approximately 0.07 volts with a 1.5 volt oscillator 24 pulse amplitude.

Meanwhile the transistor 34 turns off and isolates the nodes 42 and 43, because the gate voltage of the transistor 34 is at the supply voltage which is lower than both its drain and source voltages. Thus, the transistor 34 is advantageous because it isolates the nodes 42 and 43 from one another and allows the node 42 to move up and down to follow the oscillator 24 voltage. This enables a full supply voltage swing to be transferred to the node 40.

As the oscillator 24 voltage swings down, the node 41 is discharged to ground while the node 42 is coupled down to the supply voltage. Meanwhile, the charge transfer node 40 is bootstrapped down from the supply voltage plus $\Delta WL$. However, as soon as the node 40 reaches one threshold voltage of the transistor 31 below the voltage on the address line 18, the transistor 31 turns on and the higher voltage supply 22 charges up the node 40 until it reaches one threshold voltage of the transistor 31 below the voltage on the address line 18.

The node 40 potential becomes equal to the supply voltage plus $\Delta WL$ minus one volt (i.e., 0.5 volts plus $\Delta WL$). As soon as the node 40 is below the voltage of the address line 18, the charge transfer transistor 32 turns off, preventing charge from flowing back from the address line 18 to the node 40.

At the end of the first oscillator pulse, the address line 18 is pumped up by $\Delta WL$ volts. The address line voltage increases with each oscillator clock cycle, as explained above.

The X decoder 12 discharges the unselected address lines to ground. A charge pump coupled to an unselected address line operates as follows. Since the transistor 31 is off, it effectively cuts off any current flowing from the higher voltage source 22 to the address line 18. Meanwhile, with its gate at ground, the transistor 33 is also off. The transistor 33 isolates the oscillator clock swing from the node 41.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A semiconductor memory comprising:
a memory array; and
a charge pump coupled to said memory array to boost the charge on an address line of said memory array, said charge pump including a port to receive a signal from an oscillator and to transfer charge from said oscillator using a depletion type transistor that is selectively coupled to said oscillator only when the address line is selected.

2. The memory of claim 1 wherein said depletion type transistor includes a depletion transistor with its source and drain coupled together as an active capacitor.

3. The memory of claim 1 including a charge transfer node coupled to receive charge from said oscillator through said depletion type transistor and a switch to selectively couple said address line to said charge transfer node.

4. The memory of claim 3 including a switch to couple the port to said charge transfer node only when the address line is selected.

5. The memory of claim 4 wherein said charge transfer node is coupled to said oscillator output via said depletion type transistor.

6. The memory of claim 4 including a first transistor to gate the oscillator output to said depletion type transistor, said first transistor having a gate selectively coupled to said address line.

7. The memory of claim 6 including a second transistor to isolate said address line from said gate, said second transistor having a gate coupled to a supply voltage.

8. The memory of claim 4 including a logic enhancement type device between said port and said charge transfer node.

9. The memory of claim 1 including a switch between said port and said address line to selectively isolate said oscillator from said address line.

10. The memory of claim 1 wherein said charge pump to couple substantially the entire supply voltage level from said oscillator to said depletion type transistor.

11. A semiconductor memory comprising:

a memory array;

a charge pump coupled to said memory array to boost the charge on an address line of said memory array, said charge pump including a port to receive a signal from an oscillator and to transfer a charge from said oscillator using a depletion type transistor; and a first transistor to gate the oscillator output to said depletion type transistor, said first transistor having a gate selectively coupled to said address line.

12. The memory of claim 11 wherein said depletion type transistor includes a depletion transistor with its source and drain coupled together as an active capacitor.

13. The memory of claim 11 including a charge transfer node coupled to receive charge from said oscillator through said depletion type transistor and a switch to selectively couple said address line to said charge transfer node.

14. The memory of claim 13 including a switch to couple the port to said charge transfer node only when the address line is selected.

15. The memory of claim 14 wherein said charge transfer node is coupled to said oscillator output via said depletion type transistor.

16. The memory of claim 14 including a second transistor to isolate said address line from said gate, said second transistor having a gate coupled to a supply voltage.

17. The memory of claim 14 including a logic enhancement type device between said port and said charge transfer node.

18. The memory of claim 11 including a switch between said port and said address line to selectively isolate said oscillator from said address line.

19. The memory of claim 11 wherein said charge pump to couple substantially the entire supply voltage level from said oscillator to said depletion type transistor.

* * * * *